United States Patent

Nishimura

[11] Patent Number: 5,191,395
[45] Date of Patent: Mar. 2, 1993

[54] MOS TYPE SEMICONDUCTOR DEVICE WITH MEANS TO PREVENT PARASITIC BIPOLAR TRANSISTOR

[75] Inventor: Takeyoshi Nishimura, Kanagawa, Japan

[73] Assignee: Fuji Electric Co., Ltd., Kanagawa, Japan

[21] Appl. No.: 678,440

[22] Filed: Apr. 1, 1991

[30] Foreign Application Priority Data

Apr. 2, 1990 [JP] Japan ................................. 2-87889
Jul. 9, 1990 [JP] Japan ................................. 2-181159

[51] Int. Cl.$^5$ ........................................... H01L 29/78
[52] U.S. Cl. ................................. 257/328; 257/341; 257/355; 257/378; 257/577; 257/653
[58] Field of Search ....................... 357/23.4, 13, 41

[56] References Cited

U.S. PATENT DOCUMENTS

| | | | |
|---|---|---|---|
| 4,631,564 | 12/1986 | Neilson et al. | 357/23.4 |
| 4,688,323 | 8/1987 | Yoshida et al. | 357/23.4 |
| 4,819,044 | 4/1989 | Murakami | 357/23.4 |
| 4,862,233 | 8/1989 | Matsushita et al. | 357/23.4 |
| 4,990,976 | 2/1991 | Hattori | 357/23.4 |
| 5,005,061 | 4/1991 | Robb et al. | 357/23.4 |
| 5,089,864 | 2/1992 | Sakurai | 357/23.4 |

FOREIGN PATENT DOCUMENTS

| | | | |
|---|---|---|---|
| 54-112179 | 9/1979 | Japan | 357/23.4 |
| 57-206073 | 12/1982 | Japan | 357/23.4 |
| 60-249367 | 12/1985 | Japan | 357/23.4 |
| 62-39069 | 2/1987 | Japan | 357/23.4 |
| 62-235785 | 10/1987 | Japan | 357/23.4 |
| 1-215067 | 8/1989 | Japan | 357/23.4 |

*Primary Examiner*—Rolf Hille
*Assistant Examiner*—Steven Loke
*Attorney, Agent, or Firm*—Finnegan, Henderson, Farabow, Garrett and Dunner

[57] ABSTRACT

A MOS type semiconductor device comprising a plurality of second conductivity type channel regions having a predetermined impurity density selectively formed in the surface of a first conductivity type semiconductor layer. A channel in the semiconductor layer is formed between adjacent ones of the channel regions, and source regions of the first conductivity type are selectively formed in a surface of each one of the channel regions. A well region of the second conductivity type is formed with a predetermined depth in a middle portion of each one of the plurality of channel regions and has an impurity density higher than that of the channel regions. An insulating layer is formed on the surface of the semiconductor layer, gate electrodes are formed on the insulating layer and overlaying the channel in the first conductivity type semiconductor layer, and a main electrode is formed in contact with at least one of the source region and the well region. A diffusion region of the second conductivity type is formed in the surface of the semiconductor layer with an impurity density greater than the impurity density of the well region and with a depth greater than the predetermined depth, and being ohmically connected with the main electrode.

5 Claims, 3 Drawing Sheets

MOS TYPE SEMICONDUCTOR DEVICE WITH MEANS TO PREVENT PARASITIC BIPOLAR TRANSISTOR

BACKGROUND OF THE INVENTION

1. Field of the Invention

The present invention relates to MOS type semiconductor devices in which a plurality of MOS structures are formed on one surface of a semiconductor substrate so that the current flowing between main electrodes are controlled by the channel current of respective MOS structures.

2. Discussion of the Related Art

Typical of such MOS type semiconductor devices are the vertical power MOS-FET and the insulated gate type bipolar transistor (IGBT). FIG. 7 shows the structure of a conventional vertical power MOS-FET in which a high resistance n$^-$ drain region 1 is formed over an n$^+$ drain contact layer 2. A plurality of p$^-$ channel diffusion regions 3 are formed on the surface of the high resistance drain region 1 with corresponding low resistance p$^+$ well diffusion regions 4 in the middle thereof. On the surface of the respective channel diffusion regions 3 is formed a pair of n$^+$ source regions 5. Each pair of n source regions 5 is separated by a predetermined distance. A gate electrode 7 of polysilicon crystal, for example, is formed on gate oxide layer 61 so that an n-channel is formed on the surface layer 31 of the drain of the channel diffusion region 3 between separated source regions 5. A source electrode 8 is formed in contact with p$^+$ well region 4 and the source regions 5 via the gate electrode 7 and insulation layer 62 which is typically made of PSG. A drain electrode 9 is in contact with the drain contact layer 2. In an IGBT structure, a P layer is formed instead of, or under, the n$^+$ layer 2.

Each of these MOS type semiconductor devices includes a parasitic pnp bipolar transistor constructed of the n$^+$ source region 5, p$^-$ channel region 3, and n drain region 1. When an avalanche current flows into a pn junction between the p$^-$ channel region 3 and n$^-$ drain region 1 due to a reverse voltage impressed during a transient period, the above-mentioned parasitic transistor goes active and may cause damage to the MOS semiconductor device.

In order to avoid such damage, various methods of preventing the parasitic bipolar transistor from going active are used. These methods include increasing the diffusion depth of the p$^-$ well region 4 to help avalanche occur across a pn junction formed between p$^+$ well region 4 and n$^-$ drain region 1. As a result, avalanche current through this pn junction is increased. However, the avalanche current through the p$^-$ channel region 3 as a base region of the parasitic bipolar transistor is correspondingly decreased. Improvement of avalanche-sustaining margin by deep diffusion of the p$^-$ well region 4 suffers from the problems that the sustaining voltage decreases and the ON resistance increases. Another method of inhibiting the parasitic bipolar transistor decreases the resistance of the p$^-$ channel region 3. However, any method of inhibiting the parasitic bipolar transistor is susceptible to limitations in the process used to construct the semiconductor device. The same is true for the IGBT and p channel MOS type semiconductor devices in which the conductivity types are reversed from those discussed above.

SUMMARY OF THE INVENTION

The present invention has been made in view of the above circumstances and has an object to provide a method of manufacturing a MOS type semiconductive device in which the parasitic bipolar transistors in the respective MOS structures are prevented from going active, that is entering the conduction region for the parasitic bipolar transistor.

A further object of the present invention is to provide a MOS type semiconductor device having an improved avalanche-sustaining margin.

Additional object and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the MOS type semiconductor, of this invention comprises a plurality of second conductivity type channel regions having a predetermined impurity density selectively formed in the surface of a first conductivity type semiconductor layer, whereby a channel in the first conductivity type semiconductor layer is formed between adjacent ones of the second conductivity type channel regions, first conductivity type base regions selectively formed in a surface of each one of the plurality of second conductivity type channel regions, a second conductivity type well region formed with a predetermined depth in a middle portion of each one of the plurality of second conductivity type regions, the well region having an impurity density higher than the predetermined impurity density of the plurality of second conductivity type channel regions, an insulating layer formed on the surface of the semiconductor layer, gate electrodes formed on the insulating layer and overlaying the channel in the first conductivity type semiconductor layer, a main electrode formed in contact with at least one of the base region and the well region, a second conductivity type diffusion region formed in the surface of the semiconductor layer, the diffusion region having an impurity density greater than the impurity density of the well region, being formed with a depth greater than the predetermined depth, and being ohmically connected with the main electrode.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION OF THE PREFERRED EMBODIMENTS

Figure 1:
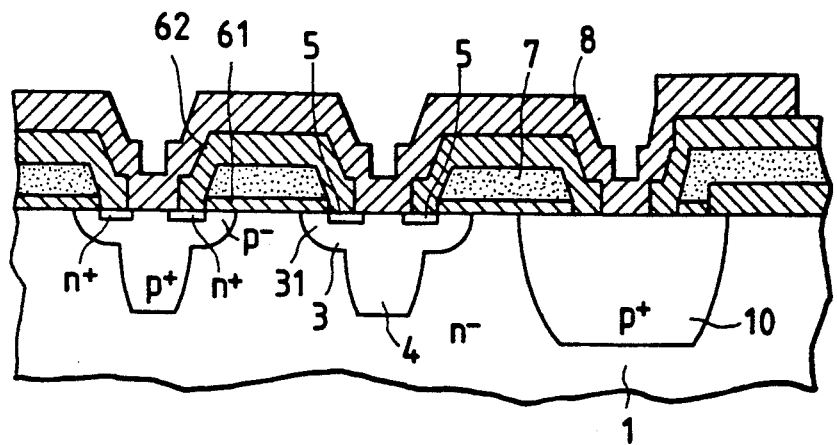
FIG. 1 is a cross-sectional view of an embodiment of a MOS type semiconductor according to the present invention.

FIG. 1 shows a low sustaining voltage vertical type MOS-FET of the first embodiment of the present invention. The MOS-FET has a p+ diffusion region 10 formed when forming a low resistance p+ well region 4.

The p+ diffusion region 10 is formed deeper than the p+ well region 4 and is connected with the main electrodes. Thus, avalanche current due to a voltage during a transient period will flow into the deep p+ diffusion region 10 rather than into the p+ well region 4, as in the conventional MOS-FET structure. As a result, parasitic or hidden bipolar transistors residing in the conventional MOS structure will not go active.

Figure 2:
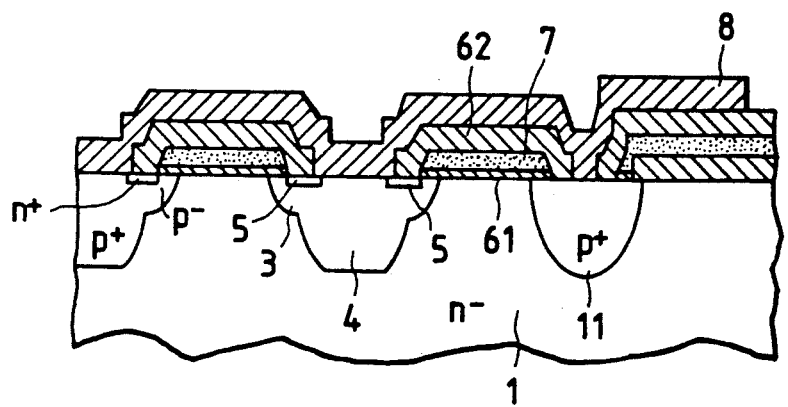
FIGS. 2-5 are cross-sectional views of various additional embodiments of the present invention.

FIG. 2 shows another embodiment of the present invention. In this embodiment, p+ diffusion region 11 has an area less than half that of diffusion region 10 of the MOS-FET in FIG. 1. Since the p+ diffusion region 11 has a smaller area, the curvature of the deepest portion is greater than that of p+ well region 4.

The p+ diffusion region 11 is connected to the main electrodes. Thus, the electric field at the junction of the p+ diffusion region 11 and the n− semiconductor layer 1 is stronger than the electric field at the junction of the p+ well region 4 and the n− semiconductor layer 1. Thus, avalanche tends to occur such that avalanche current flows into the p+ diffusion region 11 rather than into the p+ well region 4. As a result, parasitic or hidden bipolar transistors residing in the MOS structure will not go active.

Figure 3:
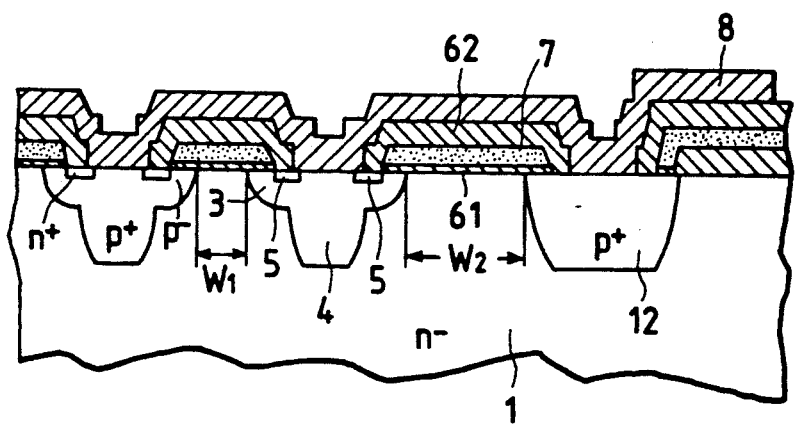

FIG. 3 shows a third embodiment of the low sustaining voltage vertical MOS-FET in which a p+ diffusion region 12 is formed with the p+ well region 4. The p+ diffusion region 12 is connected with the main electrodes. Diffusion region 12 is separated from well region 4 by a distance W2 which is larger than a distance W1 between adjacent p+ well regions 4. The distance W2 is typically selected to be more than 1.5 times the distance W1. In this arrangement, the depletion region produced by the pn junction formed by the drain region 1 and p+ diffusion region 12 cannot extend causing the avalanche current to flow into this diode structure. Thus, the avalanche current margin is improved.

Figure 4:
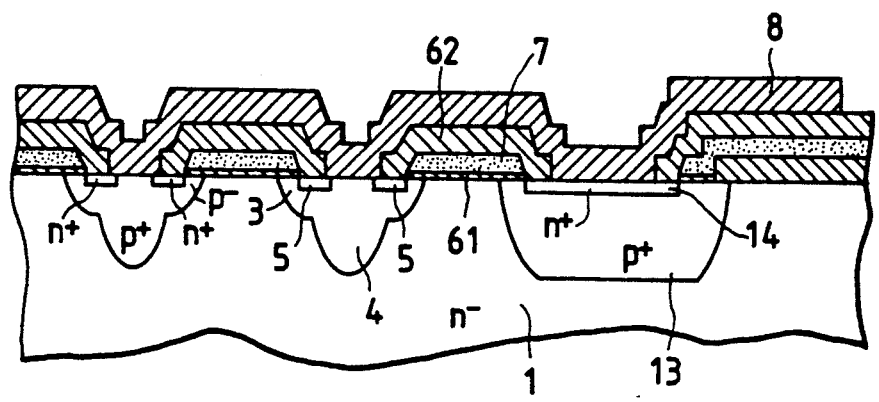

FIG. 4 shows a fourth embodiment of low sustaining voltage vertical MOS-FET wherein a p+ diffusion region 13 having a diffusion area greater than three times that of the p+ well region 4 is formed with the p+ well region 4. Then n+ region 14 is formed by using the polysilicon layer for the gate electrode as a mask when forming the n+ source region 5. Finally, the source electrode 8 is placed in contact with the n+ region 14. The bipolar transistor formed of n− drain region 1, p+ diffusion region 13, and n+ diffusion region 14 has a large current capability. When the avalanche current flows through this largecurrent capacity transistor, the avalanche current flowing into the p+ region 13 results in conduction modulation that allows a larger avalanche current to flow into the source electrode in contact with the n+ region 14 than into the pn junction diode structures in the aforementioned respective embodiments, further improving the avalanche current margin.

Figure 5:
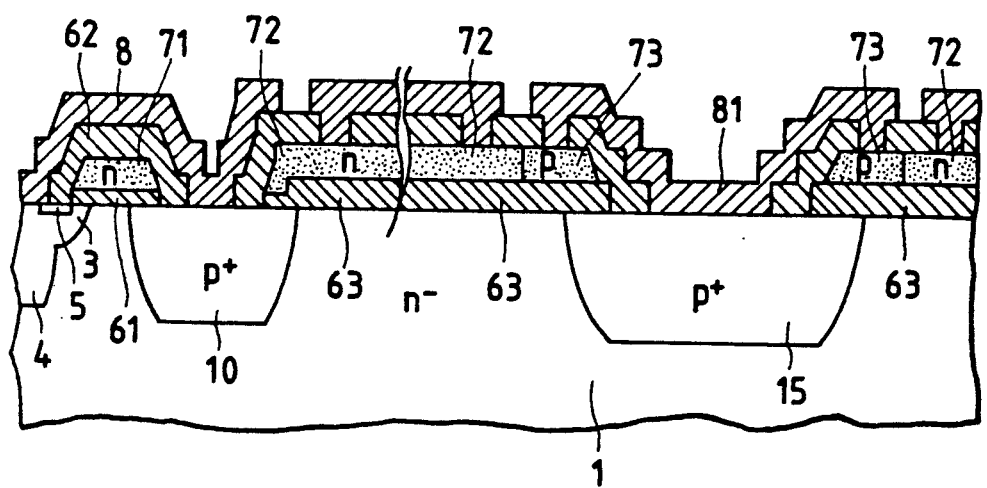

FIG. 5 shows a fifth embodiment of the invention wherein a second p+ diffusion region 15 is formed in addition to the p+ diffusion region 10 shown in FIG. 1. A gate electrode 71 is made of n-type polysilicon and forms a gate pad 72 by its extension. Between the gate pad 72 and silicon substrate is a thick field oxide 63 on which a p-type polysilicon layer 73 is formed adjacent the n-type polysilicon 72. This p type layer forms a zener diode together with an n-type layer 72 and is connected to the p+ region 15 via an Al electrode 81 in a way similar to the source electrode 8.

Figure 6:
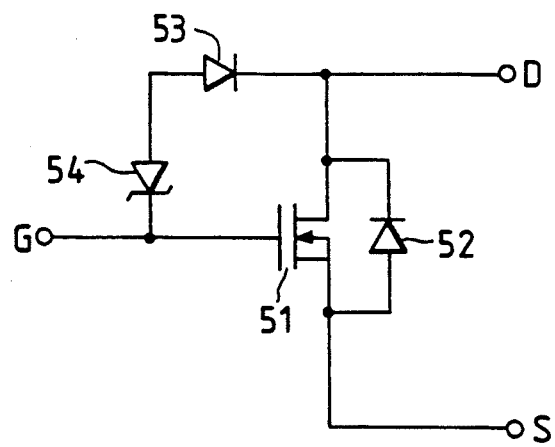
FIG. 6 shows an equivalent circuit of the MOS-FET in FIG. 5.
Figure 7:
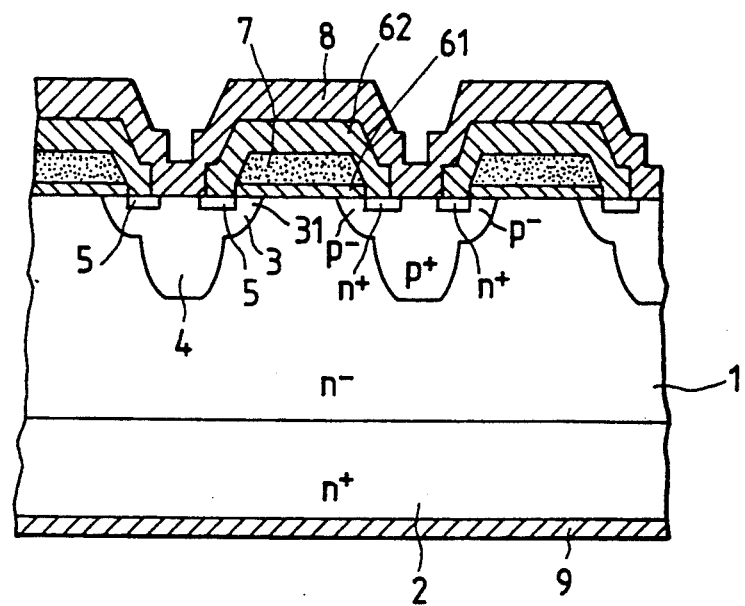
FIG. 7 is a cross-sectional view of a conventional vertical MOS-FET.

FIG. 6 is an equivalent circuit of the MOS type device according to the fifth embodiment. An FET 51 corresponds to a MOS-FET made of a conventional cell between the n− drain region 1 and the n− source region 5. A diode 52 corresponds to a diode formed of the n− region 1 and p+ region 10. A zener diode 53 corresponds to a diode formed of the n− region 1 and p+ region 15, and a zener diode 54 corresponds to a diode formed of the n-type polysilicon 72 and the p-type polysilicon 73.

In FIG. 6, terminal D represents the drain, terminal S the source, and terminal G the gate. In MOS type devices, no current flows from drain to gate unless the avalanche voltage of the diode 53 is exceeded. The positive voltage may be impressed directly on the gate terminal G since the zener voltage of the diode 54 formed in the polysilicon is selected to be higher than the possible voltage to be applied. When the diode 53 is reverse-biased by an avalanche voltage resulting in an avalanche current through the diode. Then, the avalanche current results in a voltage drop which is applied to the gate electrode to cause the device to operate. Thus, a large current flows from drain to source resulting in a power dissipation, thereby preventing damages to the other cells to improve avalanche-sustaining margin.

In order to develop the avalanche at diode 53 faster than at the others so as to prevent damages to the other cells, a majority of avalanche current flows into the diode or the transistor rather than into the conventional cells, thus preventing the conventional cells from being damaged. This provides a MOS type semiconductor device having an improved avalanche-sustaining margin. A diode is connected with the above-mentioned diode in back-to-back relation and these series-connected diodes are inserted between one of the main electrodes and the gate of the device. A channel is formed under the gate electrode by a voltage that causes avalanche so as to allow conduction between the two main electrodes of the device, thus providing a MOS type semiconductor device with an improved avalanche-sustaining margin.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A MOS type semiconductor comprising:
   a semiconductor layer of first conductivity type;
   a plurality of channel regions of second conductivity type having a predetermined impurity density, and being selectively formed in a surface of said semiconductor layer to form a plurality of channels in said semiconductor layer between adjacent ones of said channel regions;

source regions of first conductivity type selectively formed in a surface of each one of said channel regions;

a well region of second conductivity type formed with a predetermined depth in a middle portion of each one of said plurality of channel regions, said well region having an impurity density greater than the predetermined impurity density of said plurality of channel regions;

an insulating layer formed on the surface of said semiconductor layer;

gate electrodes formed on said insulating layer, each gate electrode respectively overlaying one of said plurality of channels;

a main electrode formed in contact with at least one of said source region and said well region;

a diffusion region of second conductivity type formed in the surface of said semiconductor layer and ohmically connected to said main electrode, said diffusion region being laterally separated from said plurality of channel regions by a distance greater than 1.5 times a lateral separation distance between adjacent ones of said plurality of channel regions.

2. A MOS type semiconductor comprising:
a semiconductor layer of first conductivity type;
a plurality of channel regions of second conductivity type having a predetermined impurity density, and each being selectively formed with a predetermined area in a surface of said semiconductor layer to form a plurality of channels in said semiconductor layer between adjacent ones of said plurality of channel regions;

source regions of first conductivity type selectively formed in a surface of each one of said plurality of channel regions;

a wall region of second conductivity type formed with a predetermined depth in a middle portion of each one of said plurality of channel regions, said well region having an impurity density greater than the predetermined impurity density of said channel regions;

an insulating layer formed on the surface of said semiconductor layer;

gate electrodes formed on said insulating layer, each gate electrode respectively overlaying one of said plurality of channels;

a main electrode formed in contact with at least one of said source region and said well region;

a diffusion region of second conductivity type formed in the surface of said semiconductor layer, said diffusion region being formed with an area greater than said predetermined area and with a depth substantially the same as said predetermined depth; and a single region of first conductivity type formed on a surface of said diffusion region, overlaying a substantial portion of said surface of said diffusion region, and ohmically connected to said main electrode.

3. A MOS type semiconductor device comprising:
a semiconductor layer of first conductivity type;
a plurality of channel regions of second conductivity type having a predetermined impurity density, and each being selectively formed in a surface of said semiconductor layer to form a plurality of channels in said semiconductor layer between adjacent ones of said plurality of channel regions;

source regions of first conductivity type selectively formed in a surface of each one of said plurality of channel regions;

a well region of second conductivity type formed with a predetermined depth in a middle portion of each one of said plurality of channel regions, said well region having an impurity density greater than the predetermined impurity density of said channel regions;

an insulating layer formed on the surface of said semiconductor layer;

gate electrodes formed on said insulating layer, each gate electrode respectively overlaying one of said plurality of channels;

a main electrode formed in contact with at least one of said source region and said well region;

a first diffusion region of second conductivity type formed in the surface of said semiconductor layer, said first diffusion region being laterally disposed to said well region and ohmically connected with said main electrode;

a second diffusion region of second conductivity type formed in the surface of said semiconductor layer and laterally disposed to said first diffusion region opposite to said well region;

a junction region of first conductivity type formed on said insulating layer and extending from said first diffusion region towards said second diffusion region; and a junction region of second conductivity type formed on said insulating layer adjacent to said junction region of first conductivity type and extending from said second diffusion region towards said first diffusion region, such that said second diffusion region is connected to said gate electrode via a diode structure formed by said junction region of first conductivity type and said junction region of second conductivity type.

4. The MOS type semiconductor of claim 3, wherein said second diffusion region is greater in area than said first diffusion region.

5. A MOS type semiconductor comprising:
a semiconductor layer of first conductivity type;
a plurality of channel regions of second conductivity type having a predetermined impurity density, and being selectively formed in a surface of said semiconductor layer to form a plurality of channels in said semiconductor layer between adjacent ones of said plurality of channel regions;

source regions of first conductivity type selectively formed in a surface of each one of said plurality of channel regions;

a well region of second conductivity type formed with a predetermined depth in a middle portion of each one of said channel regions, said well region having an impurity density greater than the predetermined impurity density of said channel regions, and being formed with a predetermined curvature at a deepest portion of a junction between said well region and said semiconductor layer;

an insulating layer formed on the surface of said semiconductor layer;

gate electrodes formed on said insulating layer, each gate electrode respectively overlaying one of said plurality of channels;

a main electrode formed in contact with at least one of said source region and said well region;

a diffusion region of second conductivity type formed in the surface of said semiconductor layer and ohmically connected to said main electrode, said diffusion region being formed with a curvature at a deepest portion of a junction between said diffusion region and said semiconductor layer greater than said predetermined curvature at said deepest portion of said junction between said well region and said semiconductor layer.

* * * * *

UNITED STATES PATENT AND TRADEMARK OFFICE
CERTIFICATE OF CORRECTION

PATENT NO. : 5,191,395
DATED : March 02, 1993
INVENTOR(S) : Takeyoshi Nishimura

It is certified that error appears in the above-indentified patent and that said Letters Patent is hereby corrected as shown below:

Claim 2, column 5, line 40 change "wall" to --well--.

Signed and Sealed this

Thirty-first Day of August, 1993

Attest:

Attesting Officer

BRUCE LEHMAN

Commissioner of Patents and Trademarks